United States Patent [19]
Dupont et al.

[11] Patent Number: 5,432,634
[45] Date of Patent: Jul. 11, 1995

[54] ELECTROMAGNETIC WAVE MODULATOR WITH QUANTUM WELL STRUCTURE

[75] Inventors: Emmanuel Dupont, Chatenay Malabry; Dominique Delacourt, Paris; Michel Papuchon, Villebon Palaiseau, all of France

[73] Assignee: Thomson-CSF, Paris, France

[21] Appl. No.: 135,338

[22] Filed: Oct. 13, 1993

[30] Foreign Application Priority Data

Oct. 13, 1992 [FR] France .................. 92 12211

[51] Int. Cl.$^6$ .............................................. G02F 1/015
[52] U.S. Cl. ...................................... 359/248; 359/245; 359/259
[58] Field of Search .............. 359/237, 238, 245–248, 359/259; 372/92, 97

[56] References Cited

U.S. PATENT DOCUMENTS

| | | | |
|---|---|---|---|
| 5,017,974 | 5/1991 | Greene | 359/245 X |
| 5,105,301 | 4/1992 | Campi | 359/245 |
| 5,202,897 | 4/1993 | Whitehead | 372/92 |
| 5,208,695 | 5/1993 | Dutta | 359/245 |
| 5,323,019 | 6/1994 | Dutta et al. | 359/246 X |

OTHER PUBLICATIONS

IEEE Electron Device Letters vol. 11, No. 5, May 1990, New York pp. 227–229, Karunasiri et al, "Tunable Infrared Modulator and Switch Using . . . ".

Applied Physics Letters vol. 59, No. 5 Jul. 29, 1991, New York pp. 555–557, Vodjdani et al, "Tunneling Assisted Modulation of . . . ".

Proc. 18th Int. Symp. on Gallium Arsenide and Related Compounds Seattle, Wash. Sep. 9–12, 1991 pp. 625–630, Sirtori et al, "Second Harmonic Generation In . . . ".

IEEE Journal of Quantum Electronics vol. 27, No. 3, Mar. 1991, New York pp. 702–707 Chan et al, "Field Induced Optical Effects . . . ".

*Primary Examiner*—John D. Lee
*Attorney, Agent, or Firm*—Oblon, Spivak, McClelland, Maier & Neustadt

[57] ABSTRACT

The invention pertains to an electromagnetic wave modulator comprising a quantum well semiconductor structure having two adjacent wells, the coupling of which is modified under the effect of an electrical field by the use of the phenomenon of anti-crossing of resonating levels. With this type of modulator, it is possible to attain 20% of modulation (as in the prior art) but with heightened sensitivity to the electrical field and a very short response time.

10 Claims, 7 Drawing Sheets

ELECTROMAGNETIC WAVE MODULATOR WITH QUANTUM WELL STRUCTURE

BACKGROUND OF THE INVENTION

1. Field of the Invention

The invention relates to an electromagnetic wave modulator comprising a quantum well semiconductor structure, working notably in the 8–13 μm range of wavelengths.

2. Description of the Prior Art

For many years now, the development of the techniques for growing semiconductor structures has enabled the making of artificial materials with novel quantum properties. Indeed, the association of different semiconductors in thin layers results in discontinuities of the conduction band and of the valence band all along the axis of growth. These discontinuities of the potential energy of the electrons in the conduction band and of the holes in the valence band have been extensively studied and exploited in high mobility transistors, for example. By associating two semiconductor materials, it is thus possible to form two steps of potential energy having opposite directions, this result being obtained on a distance that is shorter than the de Broglie wavelength of the electron or of the hole. In such a system, which is also called a quantum well system, the electron states are no longer distributed in a continuum but in subbands, each being associated with a quantum number and an energy level. When the well is doped, it is possible to induce electron transitions from one subband to another by means of a properly chosen electromagnetic wave with a wavelength λ: these are the inter-subband transitions illustrated in FIG. 1. The dipole associated with these transitions has a size comparable to the width L of the quantum well (giving about 0.18 L) and the corresponding state density has the shape of a Dirac function. The absorption from the fundamental level, referenced $|0>$ towards the first excited level referenced $1|1>$ is therefore resonant and relatively intense in a symmetrical well.

In the GaAs/GaAlAs type III/V semiconductor systems, this absorption is about 0.3% when these semiconductors are doped with $10^{12}$ electrons per cm² and illuminated at the Brewster angle. Many approaches have already been considered to obtain the modulation of this electromagnetic wave by using the inter-subband transitions within doped multiple quantum well structures.

A first approach pertains to the modification of the states and energies $E_i$ of a multiple quantum well structure by the application of an electrical field. The energy difference between levels is thus disturbed and, consequently, the resonance photon energies: $E_j - E_i = hc/\lambda_{ij}$ (with h being the Planck's constant, c the velocity of light, $\lambda_{ij}$ the wavelength) are modified. This electrooptical effect is low in the symmetrical structures for it is a third-order non-linear susceptibility that is brought into play. In an asymmetrical structure, this effect is linear and more effective for it is then essentially a second-order susceptibility that comes into play. The absorption peaks get shifted under the effect of the electrical field applied. This is the Clark effect, which was clearly demonstrated in 1990 ("Tunable Infrared Modulator And Switch Using Stark Shift In Step Quantum Wells", R. P. G. Karunasini, Y. J. Mii, K. L. Wang, *IEEE Electron Device Letters*, Vol. 11, No. 5). Taking a given wavelength, and amplitude, a phase modulator is thus defined by simple translation of the dispersal of real and imaginary indices associated with the inter-subband transition, this being achieved under the effect of an electrical field.

A second approach consists in the making of a charge transfer modulator ("Tunnelling Assisted Modulation of the Inter-Subband Absorption in Double Quantum Wells", M. Vodjdani, D. Vinter, V. Berger, in *Applied Physics Letters*, vol. 59, No. 5). This type of device seeks the modification, by electrical means, of the concentration $N_S$ of carriers per unit of area. To do this, two weakly coupled wells are used. At negative voltage, only the large well is populated and the inter-subband transition is relative to this well. By applying a positive voltage, the carriers are transferred, by tunnel passage, into the narrowest well as illustrated in FIG. 2. Since the fundamental level of this well is populated, it is possible to measure an inter-subband absorption associated with this well, hence one with a shorter wavelength. Thus, a two-color modulator is obtained.

SUMMARY OF THE INVENTION

The two modulators mentioned here above have sensitivities that enable 20% of modulation to be attained. The present invention proposes a modulator with increased sensitivity that relies on another mode of operation. Indeed, in the invention, it is no longer sought, between two adjacent wells under the action of an electrical field, to modify the energy difference between two levels or even to modulate the concentration of electrons at the fundamental level but to change the coupling between two excited levels. For, it is sought to modify the states of two coupled wells by applying the Pauli exclusion principle or, more specifically, by using the phenomenon of the anti-crossing of resonant levels. To this end first of all, two independent quantum wells (the barrier between them has a substantial width) are considered. For these quantum wells, the first level $|1>$ of energy ϵ excited by a first well 1 is aligned with the level $|2>$ of a second well 2. These levels are said to be in resonance. FIG. 3 illustrates a possible configuration in which the excited state $|1>$ is aligned with a state $|2>$ which is the fundamental state of the well 2. On the discrete states, there are represented the wave functions whose square describes the density of probability of the presence of an electron on said states. In reducing the thickness of the barrier between the two wells, the states $|1>$ and $|2>$ are disturbed by the proximity of the neighboring well. The resolution of Schrödinger's equation of the total structure with the two coupled wells reveals two states:

-a bonding state: $|L> = \frac{1}{\sqrt{2}} (|1> + |2>)$

-an anti-bonding state: $|A> = \frac{1}{\sqrt{2}} (|1> - |2>)$

The energy difference between these two states is no longer zero (anti-crossing phenomenon), depends notably on the energy of confinement $E_c$ of the undisturbed levels and is equal to $V_b - \epsilon$, $V_b$ representing the height of the barrier between two wells.

It may be noted that the bonding level always has lower energy than the anti-bonding level.

Under the effect of an electrical field, it is possible to uncouple the wells; indeed, under the effect of an electrical field F, the energy difference between the two levels $|L>$ and $|A>$ tends towards the value: $eF(Z_{22}-Z_{11})$ where $Z_{11}$ and $Z_{22}$ represent the barycenters of the wave functions and, by the same token, densities of probability of the presence of an electron associated with the states $|1>$ and $|2>$. By applying a positive electrical field to the structure, the probability of presence in the well 1 associated with the bonding state increases, and the probability of presence associated with the anti-bonding state gets "concentrated" in the well 2.

Under the effect of a negative electrical field, the probability of presence associated with the bonding state diminishes in the well 1 while the probability of presence associated with the anti-bonding state increases to the level of said well. FIG. 4 illustrates the behavior, under positive voltage and under negative voltage, of the probabilities of the presence of electrons at the different energy levels.

When there is no electrical field, there are observed two inter-subband transitions $|0\text{------}>|L>$ and $|0\text{------}>|A>$ of equal intensity since the states $|L>$ and $|A>$ are linear combinations with equal weights of the states $|1>$ and $|2>$ as illustrated in FIG. 3. It is possible to favor one of the two transitions by applying an electrical field. Indeed, a positive electrical field favors the transition $|0\text{------}>|L>$ and a negative electrical field favors the transition $|0\text{------}>|A>$. The object of the invention therefore is a modulator having two inter-subband absorptions, the intensity of which can be modified by an electrical field.

More specifically, the invention proposes an electromagnetic wave modulator comprising a doped semiconductor structure having a stack of layers constituted by semiconductor materials enabling the creation of potential wells and comprising means for placing the semiconductor structure under voltage, wherein this structure comprises a potential well $P_1$ possessing at least one discrete energy level $e_0$ populated with electrons and one discrete energy level $e_1$ such that $e_1$ is greater than $e_0$, a potential well $P_2$ possessing at least one discrete energy level $e_2$ such that $e_2$ and $e_1$ are equal. The wells $P_1$ and $P_2$ are designed so as to equal $e_1$ and $e_2$. The resonance lifts the degeneracy between these two levels and therefore creates the states $e_L$ and $e_A$ with $e_L$ and $e_A$ greater than $e_0$ and $e_1=e_2$ ranging from $e_L$ to $e_A$. The modulation of an incident electromagnetic wave results from the absorption variations related to transitions between, firstly, the levels $e_0$ and $e_L$ and, secondly, the levels $e_0$ and $e_A$ under the effect of a voltage applied to the structure.

The modulator according to the invention can advantageously be designed on the basis of a structure having two quantum wells $P_1$ and $P_2$, the well $P_2$ having a fundamental energy state $e_2$ that is equal to the energy $e_1$ of the excited level $|1>$ of the well $P_1$.

To have sufficient lifting of degeneracy of the states $|1>$ and $|2>$, the wells $P_1$ and $P_2$ should be close enough to provide for the desired coupling. For this purpose, there should be an overlapping of the wave functions and, hence, these wells should be separated by a distance smaller than the de Broglie wavelength $\lambda_B$ with $\lambda_B$ proportional to $E_c^{-\frac{1}{2}}$ if $E_c$ represents the energy between the potential $V_B$ of the barrier between the two wells and the energy of the excited state $|1>$ of the well 1. Preferably, the well $P_1$ used in the invention has a small energy $E_c$ that generates a fairly low confinement thus enabling an increase in the length $\lambda_B$ necessary for the coupling of the two wells.

The structure used in the invention can advantageously be prepared on the basis of two asymmetrical wells $P_1$ and $P_2$ such that the potential energy $V_1$ of the well $P_1$ is smaller than the potential energy $V_2$ of the well $P_2$. With a configuration such as this, it is possible to use a control voltage that is lower than that needed in the case of a double well configuration with the same depth to obtain the same electro-absorption effect. A system with two symmetrical wells would not work efficiently.

The modulator according to the invention may be made, for example, out of $Ga_{1-x}Al_xAs$ materials, where the composition x is variable.

BRIEF DESCRIPTION OF THE DRAWINGS

The present invention will be understood more clearly and other advantages will appear from the following description and from the appended figures, of which:

FIG. 3a gives a schematic view of the wells $P_1$ and $P_2$ in a configuration where there is no coupling;

FIG. 3b gives a schematic view of the wells $P_1$ and $P_2$ in a configuration where there is coupling;

MORE DETAILED DESCRIPTION

The electromagnetic wave modulator with quantum well structure according to the invention can advantageously work in the 8-13 μm range in being designed with standard semiconductor materials such as those using intermediate concentrations of aluminium in the GaAlAs system. A multiple quantum well structure can be made by molecular beam epitaxy on a GaAs substrate. In the quantum structure used in the modulator according to the invention, inter-subband transitions are created from a level populated with electrons. This populating can be achieved by an n type doping of the material, carried out by the insertion of a plane of silicon atoms within the well: the concentration in electron carriers may be typically of the order of $10^{+12}$ cm$^{-2}$. The absorption of an electromagnetic wave is preferably recorded at the Brewster angle (73° angle). This configuration makes it possible to provide an infrared wave with a polarization perpendicular to the plane of the well, this polarization being the only one that is active with respect to the electron intraband transitions. In the modulator according to the invention, the electric field is applied between two electrodes, it being possible for these electrodes to be constituted by n+ doped layers ($10^{18}$ electrons per cm$^3$) on which ohmic contacts are made by the diffusion of an AuGeNi alloy.

By using the GaAs/GaAlAs system, widths of the order of about ten meV are typically obtained at mid-height of the inter subband absorption peaks. It is therefore necessary to prepare a structure for which the minimum energy difference $\Delta E$ between the bonding state $|M\rangle$ and the anti-bonding state $|A\rangle$ is at least of the order of 20 to 30 meV to obtain a real separation of the two transitions firstly between the state $|0\rangle$ and the state $|1\rangle$ and, secondly, between the state $|0\rangle$ and the state $|A\rangle$. It is therefore necessary to have an inter-well spacing that is small enough for there to be coupling so as to ensure the lifting of degeneracy between the states $|1\rangle$ and $|2\rangle$. Furthermore, the efficiency of the coupling and decoupling of the wells $P_1$ and $P_2$ under the effect of an electrical field depends greatly on the mean distance between these two wells. For all these reasons, it is possible to use an asymmetrical structure having a deep well $P_1$ and a less deep well $P_2$.

As an example, we may indicate the parameters of a structure that can be used in a modulator according to the invention. This structure comprises:

- a Ga$_{0.75}$Al$_{0.25}$As "barrier" material with a thickness of 30 nm and a potential $V_0=242$ meV;
- a well $P_1$ made of a GaAs material with a thickness nm and a potential $V_1=0$ V;
- a coupling barrier made of Ga$_{0.75}$Al$_{0.25}$As material with a thickness of 2.5 nm and a potential $V_b=242$ meV;
- a well $P_2$ made of Ga$_{0.92}$Al$_{0.08}$As material with a thickness of 4.5 nm and a potential $V_2=242$ meV.

Figure 1:
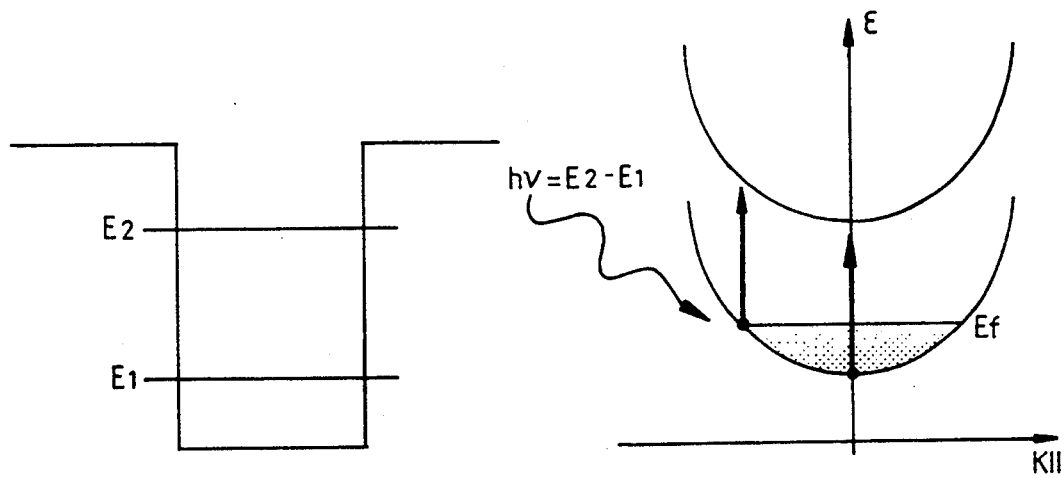
FIG. 1 gives a schematic view of the inter-subband transitions obtained in a quantum well structure.
Figure 2:
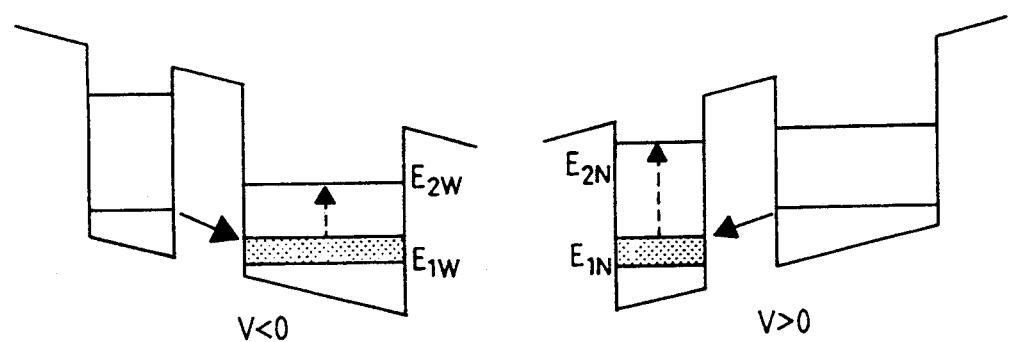
FIG. 2 illustrates the working of a modulator according to the prior art.
Figure 3A:
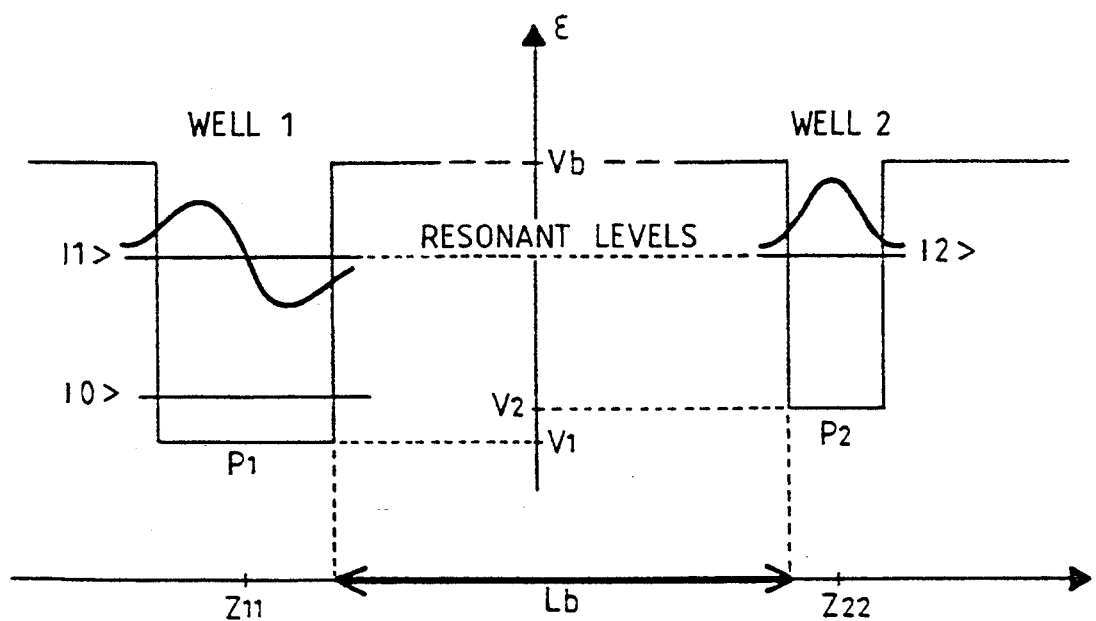
FIGS. 3a and 3b illustrate quantum well structure used in the modulator according to the invention.
Figure 3B:
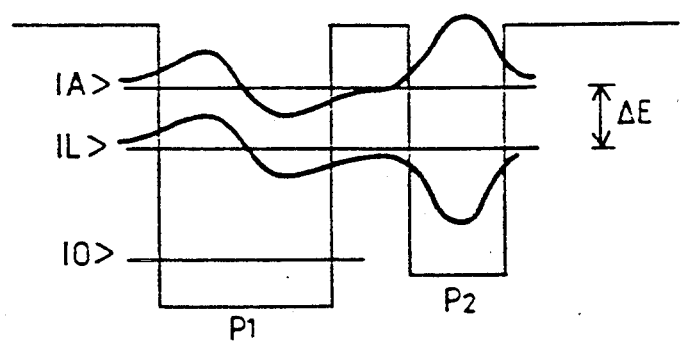
Figure 4:
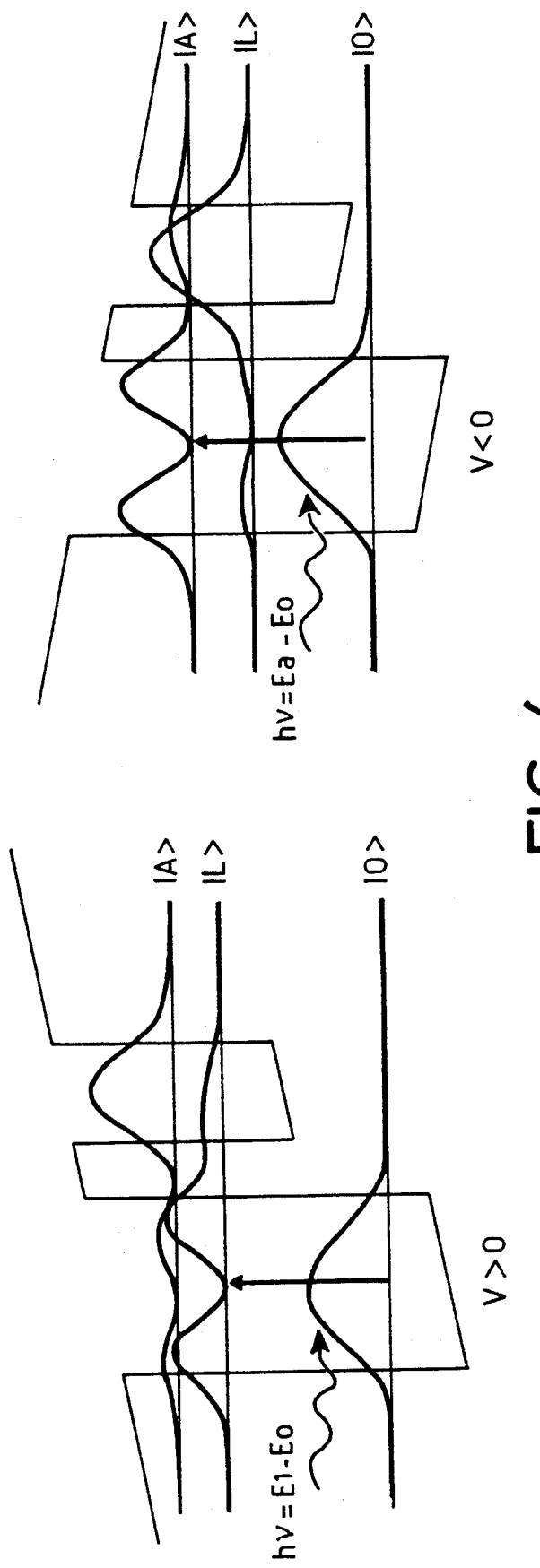
FIG. 4 illustrates the changes in density of probabilities of presence under the effect of a voltage applied to a structure used in a modulator according to the invention.
Figure 5:
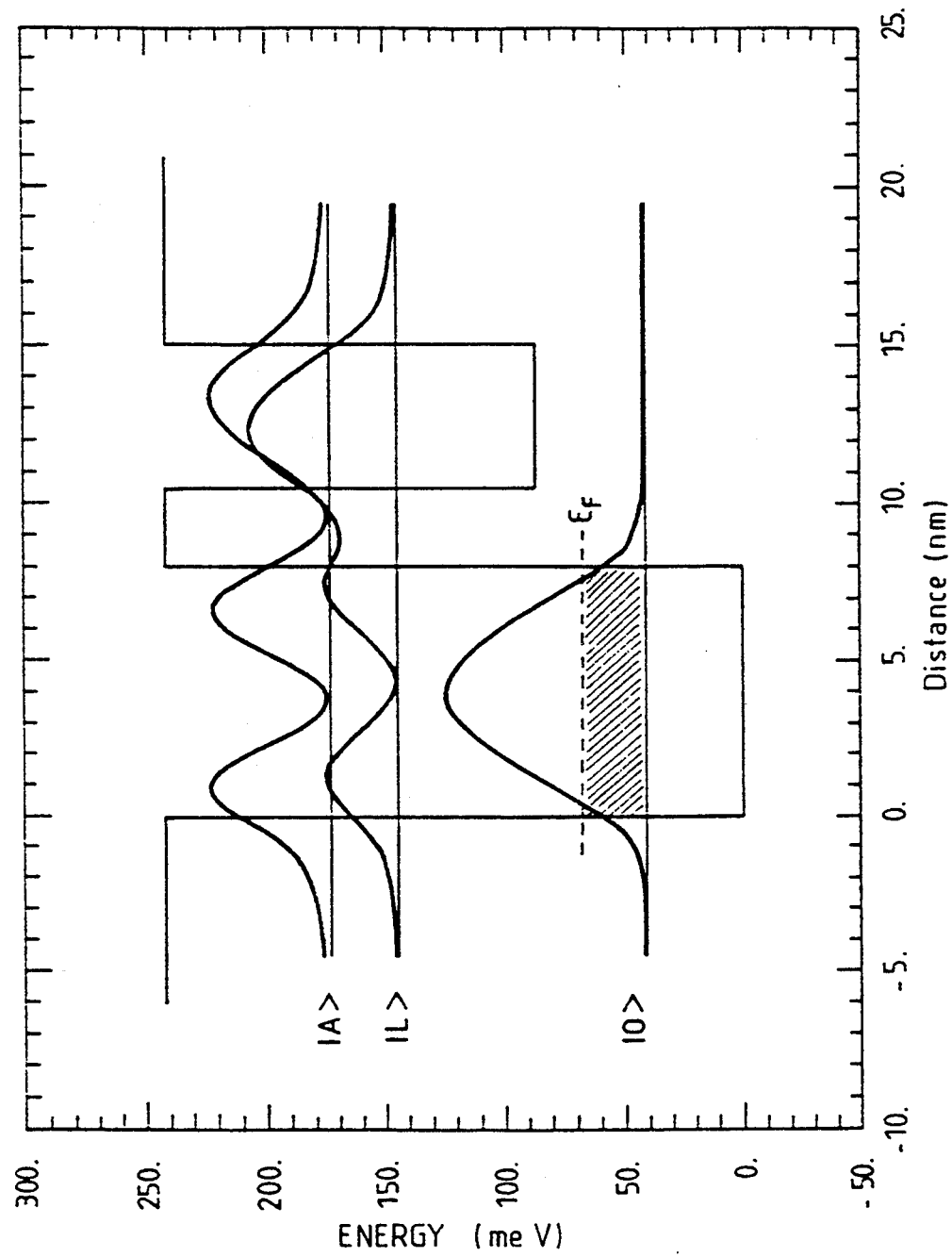
FIG. 5 illustrates the band diagram of an exemplary structure used in a modulator according to the invention.

The band diagram of this structure is shown in FIG. 5.

Figure 6:
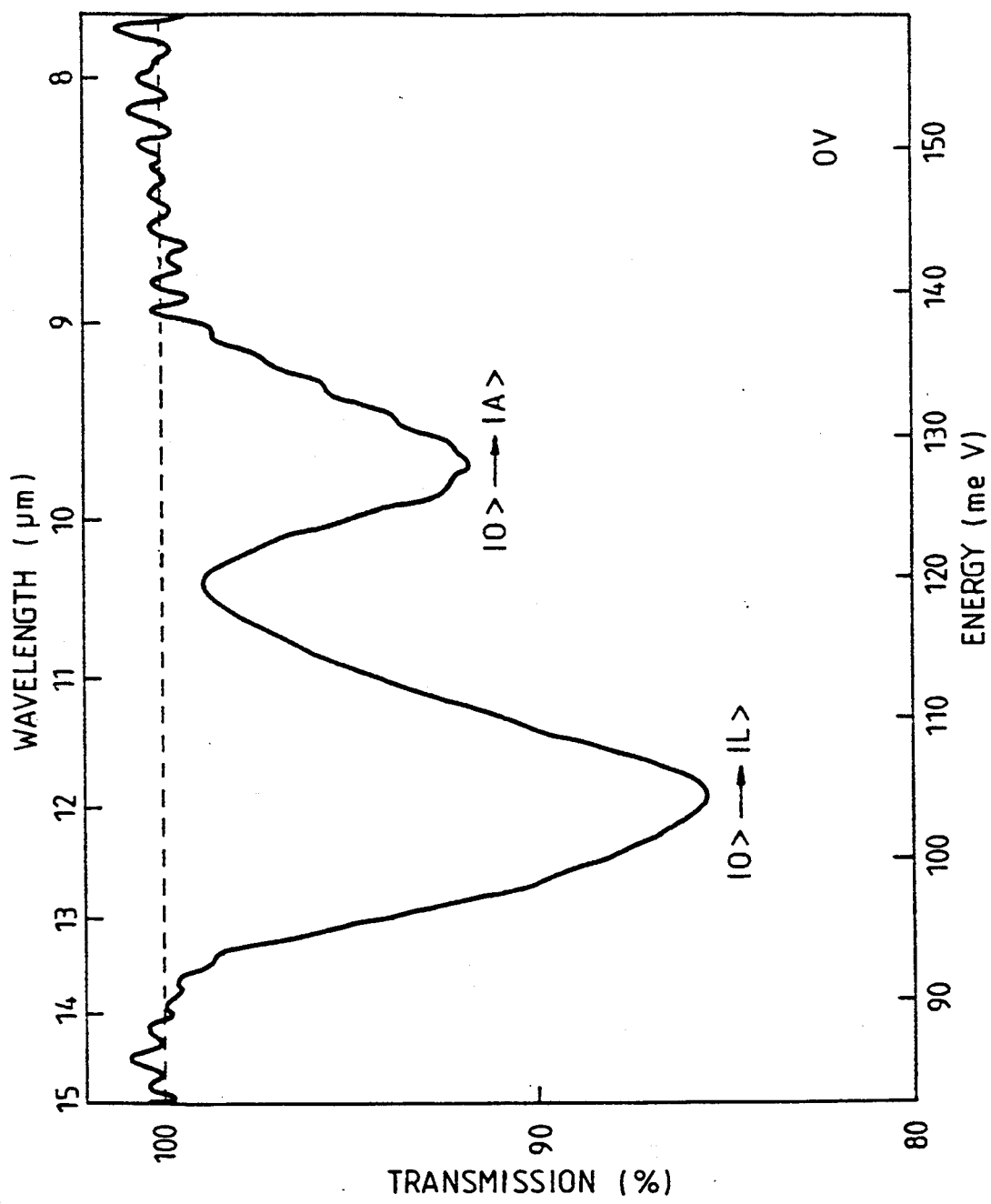
FIG. 6 illustrates the absorption peaks of an exemplary structure used in the invention, when there is no electrical field.

This structure has parameters such that they enable coupling between the two wells and, consequently, the appearance of the states $|L\rangle$ and $|A\rangle$. The photon energies corresponding to the inter-subband transitions $|0\rangle$——>$|A\rangle$ and $|0\rangle$——>$|L\rangle$ and their intensities are shown in FIG. 6 which shows the absorption spectrum at zero voltage. The absorption peaks appear clearly and are at a distance of about 25 meV from each other.

Figure 7A:
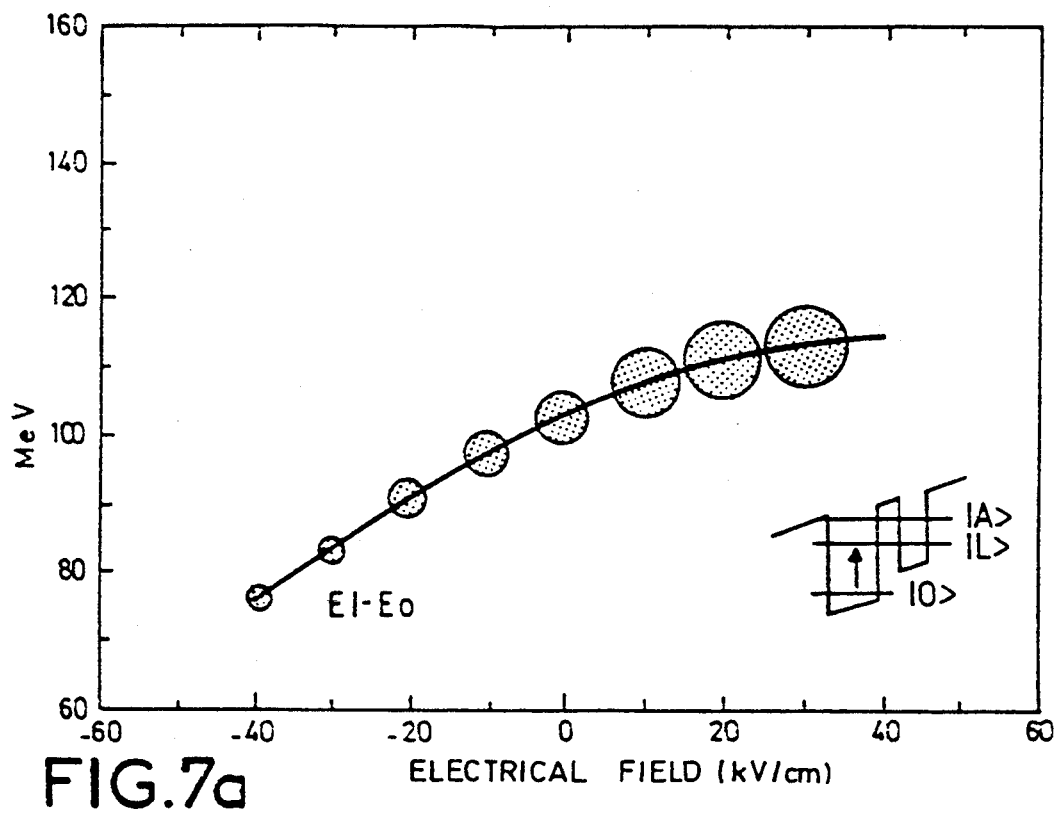
FIGS. 7a and 7b represent the changes in intensities of absorption at the transitions $|0\text{------}>|L>$ (curve 7a) and $|0\text{------}>|A>$ (curve 7b) as a function of an electrical field.
Figure 7B:
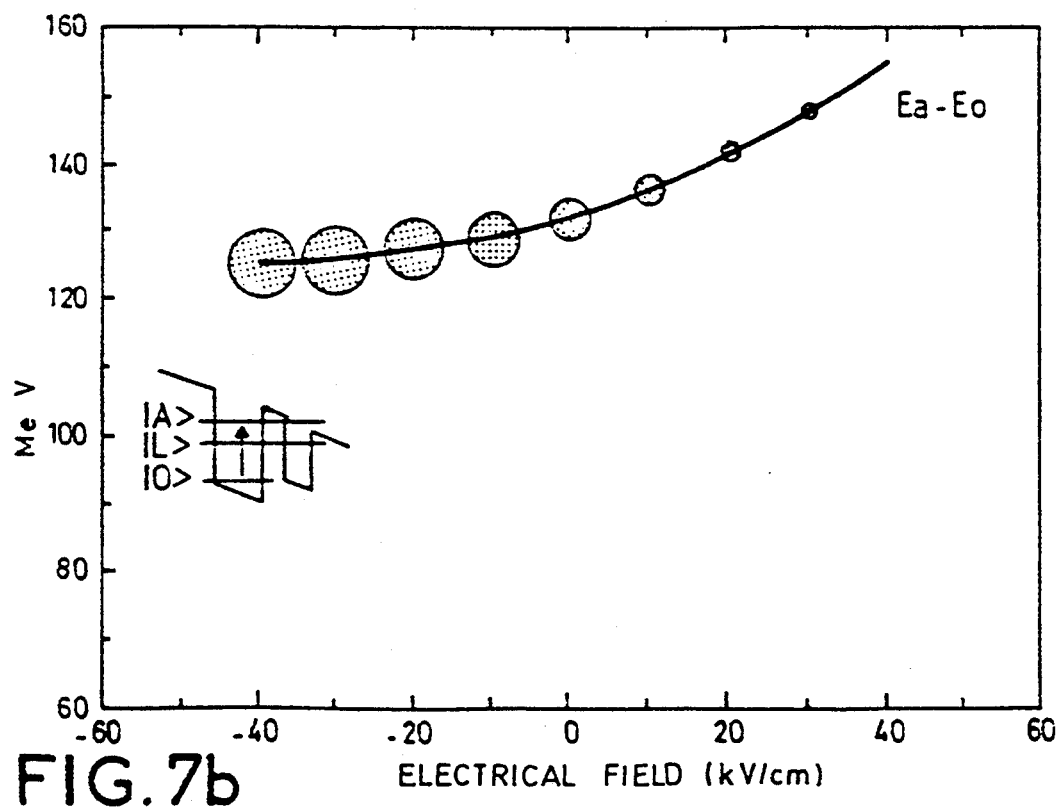

FIGS. 7 gives a schematic view, by means of the diameter of the circles, of the amplitude of absorption of an electromagnetic wave. The upper curve 7a illustrates the variation of the intensity of absorption related to the transition $|0\rangle$——>$|L\rangle$ as a function of the electrical field applied to the structure. The lower curve 7b illustrates the variation of the intensity of absorption related to the transition $|0\rangle$——>$|A\rangle$. It can clearly be seen that, for the positive fields, the transitions $|0\rangle$——>$|L\rangle$ predominates while the transition $|0\rangle$——>$|A\rangle$ gets attenuated, all the more so as the field increases. For negative electrical fields applied to the structure, the phenomenon is reversed.

Figure 8:
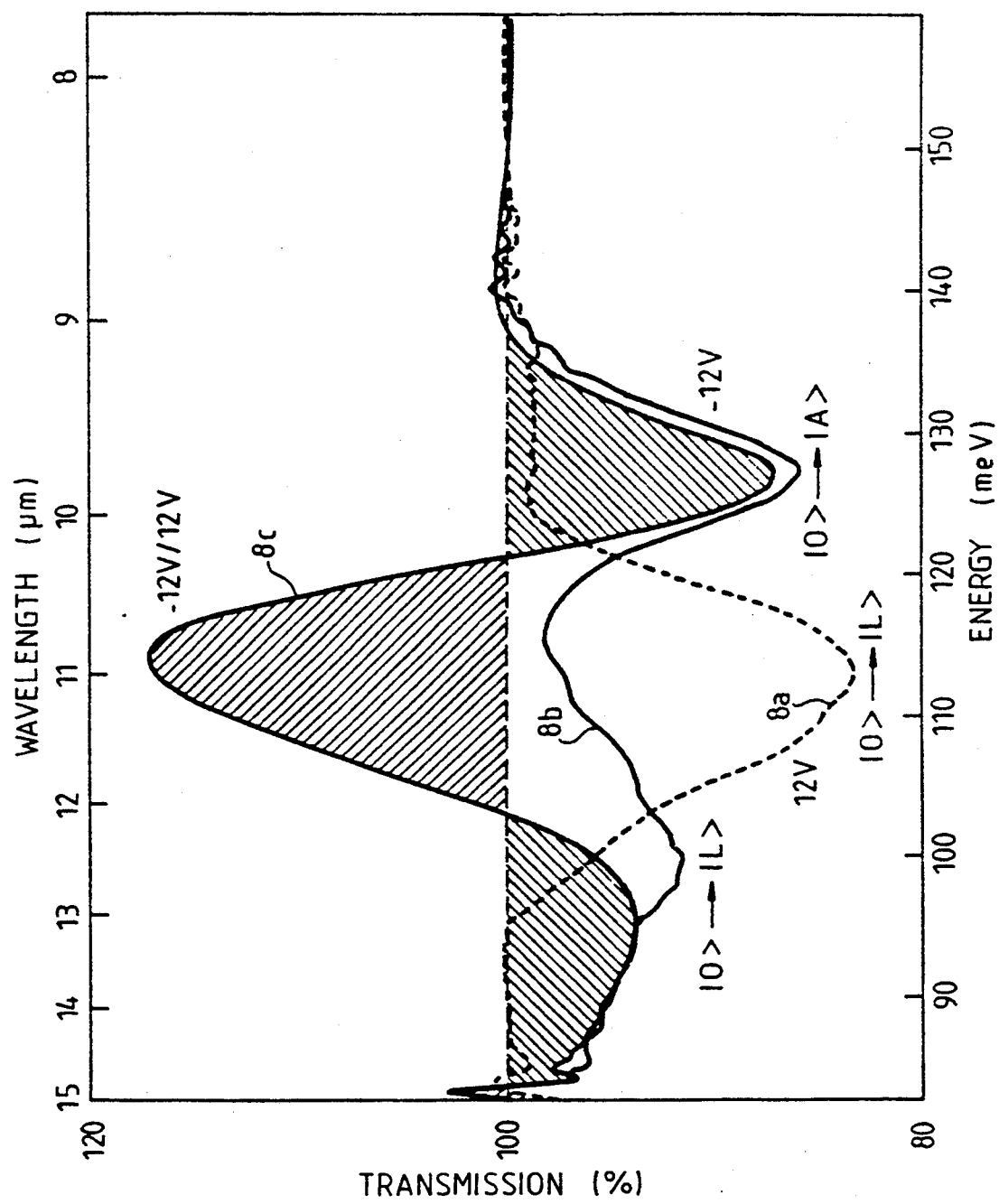
FIG. 8 shows the absorption spectra as a function of the wavelength, for an exemplary structure placed under voltage of +12 V (curve 8a) and under voltage of −12 V (curve 8b), the curve 8c giving the ratio between the curves 8a and 8b.

FIG. 8 shows the absorption spectra of the structure placed under voltage of $+12$ V (curve 8a) and under $-12$ V (curve 8b); the curve 8c illustrates the ratio of the foregoing curves. It can clearly be seen that one of the two peaks gets intensified at the expense of the other one. An examination of the ratio between the two spectra indicates that the total absorption is unchanged. For a control voltage of 24 V, 17% of depth of modulation at 10.0 μm is obtained. When the anti-crossing of the levels $|A\rangle$ and $|L\rangle \Delta E$ is the minimum, the modulation of transmission at 9.6 μm (resonance of the transition 0——>A) is 0.5% per volt applied to the structure. It is seen that this modulator can function between 9 and 14 μm. It is therefore a wideband device. The modulation can furthermore be obtained very swiftly, within the time taken to apply an electrical field, giving a period of time of the order of one picosecond, hence more swiftly than with modulators necessitating charge transfer phenomena.

What is claimed is:

1. An electromagnetic wave modulator, comprising;
    a doped semiconductor structure having a stack of layers constituted by semiconductor materials enabling the creation of potential wells;
    means for placing a voltage across the stack of layers of the semiconductor structure;
    wherein the stack of layers of the doped semiconductor structure form
    a first potential well $P_1$ possessing at least two states, one of said two states has a discrete energy level $e_0$ populated with electrons and the other one of said two states has a discrete energy level $e_1$ such that $e_1$ is greater than $e_0$;
    a second potential well $P_2$ possessing at least one state with a discrete energy level $e_2$ such that $e_2$ and $e_1$ are equal, wherein the level at energy $e_2$ is the fundamental level of the well $P_2$;
    the wells $P_1$ and $P_2$ being separated by a distance d such that the discrete energy levels at $e_1$ and $e_2$ are in resonance, the resonance creating two states at energies $e_L$ and $e_A$, with $e_L$ and $e_A$ greater than $e_0$,
    wherein modulation of an incident electromagnetic wave results from the variations of absorption related to the transitions between, firstly, the levels at energies $e_0$ and $e_L$ and, secondly, the levels at energies $e_0$ and $e_A$, as a function of the voltage across the stack of layers.

2. A modulator according to claim 1, wherein the conduction band edge potential energy $V_1$ of the semiconductor material forming the first well $P_1$ is lower than the conduction band edge potential energy $V_2$ of the semiconductor material forming the well $P_2$.

3. A modulator according to claim 1, wherein the state with the discrete energy level $e_0$ is populated by n type doping.

4. A modulator according to claim 1, wherein the semiconductor structure is prepared out of Ga$_{1-x}$Al$_x$As ($0 \leq x \leq 1$) compounds.

5. A modulator according to one of claims 1, 2, 3 or 4, wherein the state with the energy level $e_0$ is the fundamental electron energy level state of the first potential well $P_1$, the state with energy level $e_1$ is the state with the first excited electron energy level of the first potential well $P_1$, and the state with the energy level $e_2$ is the fundamental electron energy level state of the second potential well $P_2$.

6. An electromagnetic wave modulator, comprising
    a doped semiconductor structure having a stack of layers constituted by semiconductor materials enabling the creation of potential wells;
    means for placing a voltage across the stack of layers of the semiconductor structure;

wherein the stack of layers of the doped semiconductor structure form a first potential well $P_1$ possessing at least two states, one of said two states has a discrete energy level $e_0$ populated with electrons and the other one of said two states has a discrete energy level $e_1$ such that $e_1$ is greater than $e_0$;

a second potential well $P_2$ possessing at least one state with a discrete energy level $e_2$ such that $e_2$ and $e_1$ are equal and in resonance with one another which gives rise to splitting of the states with energy levels $e_2$ and $e_1$ into a bonding and an antibonding state, wherein an electric field applied across the stack of layers favors transitions into either the antibonding or bonding state;

the wells $P_1$ and $P_2$ being separated by a distance d such that the discrete energy levels at $e_1$ and $e_2$ are in resonance, the resonance creating two states at energies $e_L$ and $e_A$, with $e_L$ and $e_A$ greater than $e_0$, wherein modulation of an incident electromagnetic wave results from the variations of absorption related to the transitions between, firstly, the levels at energies $e_0$ and $e_L$ and, secondly, the levels at energies $e_0$ and $e_A$, as a function of the voltage across the stack of layers.

7. A modulator according to claim 6, wherein the conduction band edge potential energy $V_1$ of the semiconductor material forming the first well $P_1$ is lower than the conduction band edge potential energy $V_2$ of the semiconductor material forming the well $P_2$.

8. A modulator according to claim 6, wherein the state with the discrete energy level $e_0$ is populated by n type doping.

9. A modulator according to claim 6, wherein the semiconductor structure is prepared out of $Ga_{1-x}Al_xAs$ ($0 \leq x \leq 1$) compounds.

10. A modulator according to one of claims 6, 7, 8 or 9, wherein the state with the energy level $e_0$ is the fundamental electron energy level state of the first potential well $P_1$, the state with energy level $e_1$ is the state with the first excited electron energy level of the first potential well $P_1$, and the state with the energy level $e_2$ is the fundamental electron energy level state of the second potential well $P_2$.

* * * * *